US008866163B2

(12) United States Patent
Toda et al.

(10) Patent No.: US 8,866,163 B2
(45) Date of Patent: Oct. 21, 2014

(54) WHITE ORGANIC ELECTROLUMINESCENCE DEVICE

(75) Inventors: Naohiro Toda, Osaka (JP); Hiroki Noguchi, Hyogo (JP); Ayako Tsukitani, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/451,803

(22) Filed: Apr. 20, 2012

(65) Prior Publication Data

US 2012/0267652 A1 Oct. 25, 2012

(30) Foreign Application Priority Data

Apr. 21, 2011 (JP) ................................. 2011-094843

(51) Int. Cl.
H01L 29/20 (2006.01)
H01L 33/00 (2010.01)
H01L 51/50 (2006.01)
H05B 33/14 (2006.01)
H01L 51/56 (2006.01)
C09K 11/06 (2006.01)

(52) U.S. Cl.
CPC ............ *C09K 11/06* (2013.01); *H01L 51/5036* (2013.01); *C09K 2211/1037* (2013.01); *H05B 33/14* (2013.01); *H01L 51/56* (2013.01); *C09K 2211/185* (2013.01); *C09K 2211/1088* (2013.01); *C09K 2211/1029* (2013.01)
USPC .............................. 257/89; 313/504; 313/506

(58) Field of Classification Search
USPC ..................... 257/89, 40; 313/113, 504, 506
See application file for complete search history.

(56) References Cited

U.S. PATENT DOCUMENTS

| 5,851,063 A | 12/1998 | Doughty et al. |
| 7,023,013 B2 * | 4/2006 | Ricks et al. ................. 257/40 |
| 2004/0058193 A1 | 3/2004 | Hatwar |
| 2005/0056969 A1 | 3/2005 | Ghosh et al. |
| 2006/0006797 A1 * | 1/2006 | Ito et al. ..................... 313/506 |
| 2008/0191615 A1 | 8/2008 | Bechtel et al. |

FOREIGN PATENT DOCUMENTS

| EP | 1 286 569 | 2/2003 |
| JP | 61-203591 | 9/1986 |

(Continued)

OTHER PUBLICATIONS

Cheng Gang et al., "White organic light-emitting devices with a phosphorescent multiple emissive layer", Applied Physics Letters, AIP, American Institute of Physics, Melville, NY, US, vol. 89, No. 4 Jul. 25, 2006, pp. 43504-043504.

Khizar-ul Haq et al., "Red organic light-emitting diodes with high efficiency, low driving voltage and saturated red color realized via two step energy transfer based on AND and $Alq_3$ co-host system", Current Applied Physics, North-Holland, Amsterdam, NL, vol. 9, No. 1, Jan. 1, 2009, pp. 257-262.

(Continued)

*Primary Examiner* — Errol Fernandes
(74) *Attorney, Agent, or Firm* — Bacon & Thomas, PLLC

(57) ABSTRACT

A white organic electroluminescence device includes: an anode electrode; a cathode electrode; a hole transport layer arranged between the anode electrode and the cathode electrode; an electron transport layer arranged between the anode electrode and the cathode electrode; and a plurality of light emission layers into which holes and electrons are injected from the hole transport layer and the electron transport layer, the light emission layers arranged between the hole transport layer and the electron transport layer. The light emission layers are configured to have at least one emission peak wavelength for each of blue, green and red colors, and the emission peak wavelength of the blue color ranges from about 445 nm to about 455 nm.

13 Claims, 4 Drawing Sheets

(56) References Cited

FOREIGN PATENT DOCUMENTS

| | | |
|---|---|---|
| JP | 10-003990 | 1/1998 |
| JP | 10-209504 | 8/1998 |
| JP | 11-258047 | 9/1999 |
| JP | 2004-063349 | 2/2004 |
| JP | 2007-173557 | 7/2007 |
| JP | 2009-501417 | 1/2009 |
| JP | 2009-224274 | 10/2009 |

OTHER PUBLICATIONS

Viktor V. Jarikov et al., "Improving operating lifetime of organic light-emitting diodes with polycyclic aromatic hydrocarbons as aggregating light-emitting-layer additives", Journal of Applied Physics, American Institute of Physics, NY, US, vol. 100, No. 1, Jul. 5, 2006, pp. 14901-014901.

The extended European search report dated Jul. 13, 2012.

* cited by examiner

FIG. 3

|  | A | B | COMPARATIVE EX. 1 | COMPARATIVE EX. 2 |
|---|---|---|---|---|
| PEAK WAVELENGTH OF BLUE LIGHT [nm] | 445 | 455 | 440 | 460 |
| SECOND PEAK WAVELENGTH OF BLUE LIGHT [nm] | 475 | 485 | 470 | 490 |
| PEAK WAVELENGTH OF RED LIGHT [nm] | 610 | 600 | 595 | 595 |
| COLOR TEMPERATURE [K] | 6,400 | 6,400 | 6,400 | 6,400 |
| Ra | 90 | 82 | 95 | 73 |
| PS | 90 | 96 | 66 | 84 |

WHITE ORGANIC ELECTROLUMINESCENCE DEVICE

FIELD OF THE INVENTION

The present invention relates to a white organic electroluminescence device.

BACKGROUND OF THE INVENTION

A white organic electroluminescence device disclosed in, e.g., Japanese Patent Application Publication No. 2004-63349 (JP2004-63349A), has been developed for practical applications, because the white organic electroluminescence device is more advantageous in power consumption and size (thickness) than a fluorescent lamp or a bulb.

In the white organic electroluminescence device of JP2004-63349A, it is possible to increase, e.g., an average color rendering index Ra indicating the color reproducibility and to enhance a color rendering property by setting the peak wavelength of a blue light to lie in a shorter wavelength region. On the other hand, it is possible to increase, e.g., a PS (Preference index of Skin color) of Japanese women by setting the peak wavelength of a blue light to lie in a longer wavelength region.

In the conventional white organic electroluminescence device, however, the color rendering index Ra becomes lower if the peak wavelength of a blue light is set to lie in a longer wavelength, region in order to increase the skin color favorability index of Japanese women PS.

SUMMARY OF THE INVENTION

In view of the above, the present invention provides a white organic electroluminescence device capable of increasing a skin color favorability index of Japanese women PS while preventing a decrease in color rendering property.

In accordance with an aspect of the present invention, there is provided a white organic electroluminescence device including: an anode electrode; a cathode electrode; a hole transport layer arranged between the anode electrode and the cathode electrode; an electron transport layer arranged between the anode electrode and the cathode electrode; and a plurality of light emission layers into which holes and electrons are injected from the hole transport layer and the electron transport layer, the light emission layers arranged between the hole transport layer and the electron transport layer.

The light emission layers are configured to have at least one emission peak wavelength for each of blue, green and red colors, and the emission peak wavelength of the blue color ranges from about 445 nm to about 455 nm.

The light emission layers may be configured such that the emission peak wavelength of the red color is about 600 nm or more.

With the present invention, it is possible to provide a white organic electroluminescence device capable of increasing a skin color favorability index of Japanese women PS while preventing a decrease in color rendering property.

BRIEF DESCRIPTION OF THE DRAWINGS

The objects and features of the present invention will become apparent from the following description of embodiments, given in conjunction with the accompanying drawings, in which:

FIG. 3 is an explanatory view for explaining differences in effectiveness between conditions A and B and comparative examples 1 and 2;

DETAILED DESCRIPTION OF THE EMBODIMENTS

Embodiments of the present invention will now be described with reference to the accompanying drawings which form a part hereof.

Figure 1:
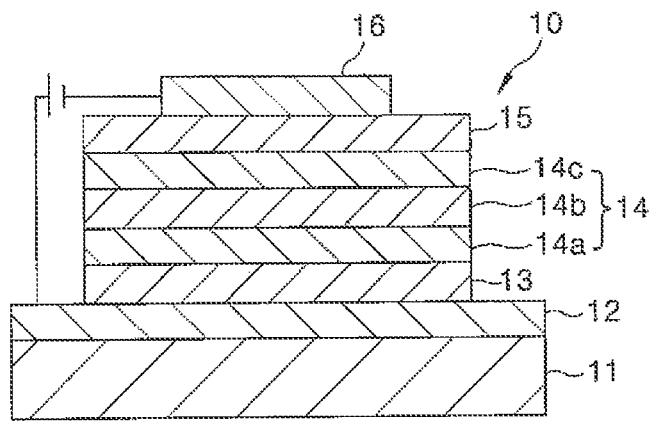
FIG. 1 is a schematic section view for explaining a layer structure of a white organic electroluminescence device in accordance with an embodiment of the present invention.

Referring to FIG. 1, the white organic electroluminescence device 10 of the present embodiment includes a substrate 11 formed of a transparent glass panel or the like. An anode electrode 12 formed of a transparent conductive film or the like is laminated on the substrate 11. A light emission layer 14 is laminated on the anode electrode 12 through a hole transport layer 13. A cathode electrode 16 is laminated on the light emission layer 14 through an electron transport layer 15.

The anode electrode 12 is an electrode for injecting holes into the device and is made, e.g., of a metal such as gold or the like or a conductive transparent material such as CuI, ITO, $SnO_2$, ZnO, IZO or the like.

The hole transport layer 13 is made of a hole-transporting material, e.g., a compound which is capable of transporting holes, has an effect of receiving holes from the anode electrode 12, has a superior effect of injecting holes into the light emission layer 14, prevents movement of electrons toward the hole transport layer 13 and has a superior thin film forming capability.

More specifically, examples of the hole-transporting material include, but are not limited to, polymer materials including a phthalocyanine derivative, a naphthalocyanine derivative, a porphyrin derivative, an aromatic diamine compound such as a N,N'-bis(3-methylphenyl)-(1,1'-biphenyl)-4,4'-diamine (TPD) or a 4,4'-bis[N-(naphthyl)-N-phenyl-amino]biphenyl (α-NPD), an oxazole, an oxadiazole, a triazole, an imidazole, an imidazolone, a stilbene derivative, a pyrazoline derivative, a tetrahydroimidazole, a polyarylalkane, a butadiene, a 4,4',4"-tris(N-(3-methylphenyl)N-phenyl-amino) triphenylamine (m-MTDATA), an electrically-conductive polymer such as a polyvinylcarbazole, a polysilane or a polyethylenedioxy thiophene (PEDOT) and the like.

The light emission layer 14 is formed of a plurality of layers each containing one kind of fluorescent substance. As shown in FIG. 1, the light emission layer 14 includes a blue region emission layer 14a having a peak wavelength in a blue region ranging from 445 nm to 455 nm and a red region emission layer 14b having a peak wavelength in a red region of 600 nm or more. The light emission layer 14 further includes a green region emission layer. The light emission layer is configured to emit a white light through the use of the blue region emission layer 14a, the red region emission layer 14b and the green region emission layer 14c.

Figure 2:
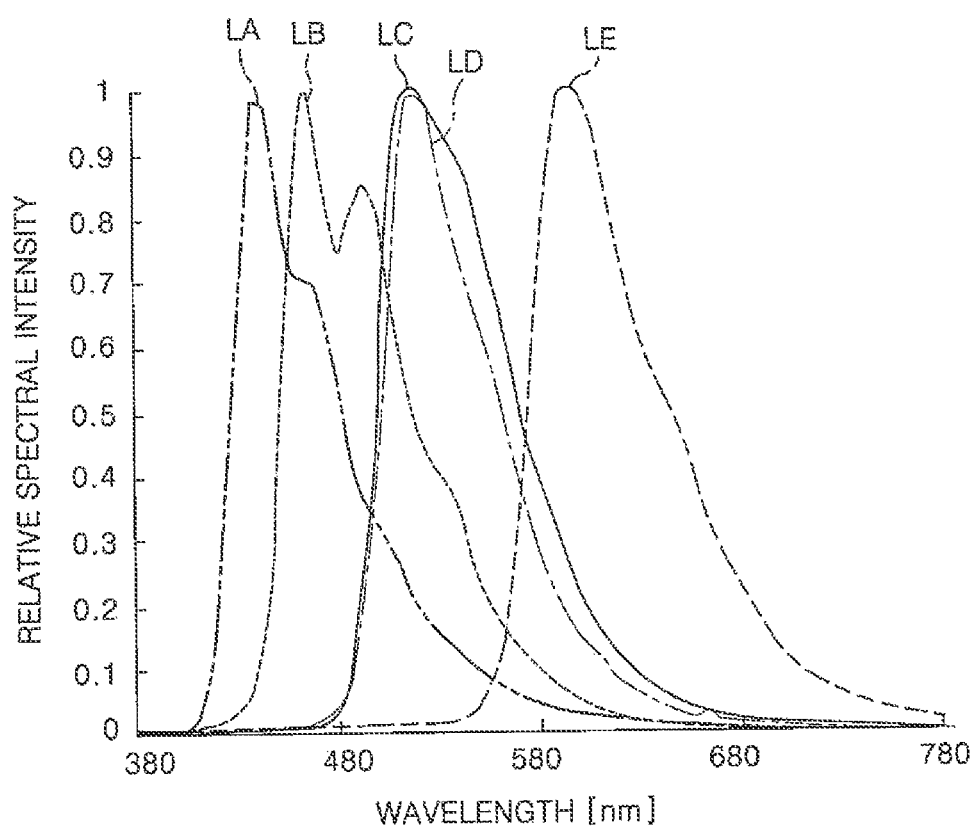
FIG. 2 is a spectral characteristic diagram explaining one example of a light emitting material making up the white organic electroluminescence device.

The blue region emission layer 14a is made of, e.g., TBP (2,5,8,11-tetra-t-butylperylene) designated by "LA" in FIG. 2 which shows a spectral distribution or sty-NPD designated by "LB" in FIG. 2. The material of the blue region emission layer 14a may be appropriately changed to other fluorescent substances having a peak wavelength in a blue wavelength region ranging from 445 nm to 455 nm.

The red region emission layer 14b is made of, e.g., $PQ_2Ir$ (acac), a red phosphorous complex, designated by "LE" in FIG. 2. The material of the red region emission layer 14b may be appropriately changed to other fluorescent substances having a peak wavelength in a red wavelength region of 600 nm or more.

The green region emission layer 14c is made of, e.g., $Ir(ppy)_3$, a green iridium complex, designated by "LC" in FIG. 2 or C545T (10-1,3-benzothiazol-2-yl)-1,1,7,7-tetramethyl-2,3,6,7-tetrahydro-1H,5H,11H-pyrano[2,3-f]pyrido[3,2,1-ij]quinoline-11-one) designated by "LD" in FIG. 2.

The electron transport layer 15 is made of an electron-transporting material, e.g., a compound which is capable of transporting electrons, has an effect of receiving electrons from the cathode electrode 16, has a superior effect of injecting electrons into the light emission layer 14 or a light emitting material, prevents movement of holes toward the electron transport layer 15 and has a superior thin film forming capability.

More specifically, examples of the electron-transporting material include fluorene, bathophenanthroline, bathocuproine, anthraquinodimethane, diphenoquinone, oxazole, oxadiazole, triazole, imidazole, anthraquinodimethane, compounds thereof, metal complex compounds thereof and nitrogen-containing pentacyclic derivatives thereof. Examples of the metal complex compounds include, but are not limited to, tris(8-hydroxy quinolinate)aluminum, tri(2-methyl-8-hydroxy quinolinate)aluminum, tris(8-hydroxy quinolinate) gallium, bis(10-hydroxy benzo[h]quinolinate)beryllium, bis(10-hydroxy benzo[h]quinolinate)zinc, bis(2-methyl-8-quinolinate)(o-crezolate)gallium, bis(2-methyl-8-quinolinate)(1-naphtholate)aluminum and the like.

As the nitrogen-containing pentacyclic derivatives, it is preferable to use oxazole, thiazole, oxadiazole, thiadiazole or triazole derivatives. More specifically, examples of the nitrogen-containing pentacyclic derivatives include, but are not limited to, 2,5-bis(1-phenyl)-1,3,4-oxazole, 2,5-bis(1-phenyl)-1,3,4-thiazole, 2,5-bis(1-phenyl)1,3,4-oxadiazole, 2-(4'-tert-bytylphenyl)-5-(4"-biphenyl)1,3,4-oxadiazole, 2,5-bis(1-naphthyl)-1,3,4-oxadiazole, 1,4-bis[2-(5-phenylthiadiazolyl)]benzene, 2,5-bis(1-naphthyl),1,3,4-triazole, 3-(4-biphenylyl)-4-phenyl-5-(4-t-butyphenyl)-1,2,4-triazole and the like. Moreover, it is possible to use polymer materials for use in manufacturing a polymer-based organic electroluminescence device. Examples of the polymer materials include polyparaphenylene, derivatives thereof, fluorene, derivatives thereof and the like.

The cathode electrode 16 is an electrode for injecting electrons into the light emission layer 14. The cathode electrode 16 is preferably made of an electrode material including a metal, an alloy, an electrically conductive compound and mixtures thereof, all of which have a small work function. More specifically, examples of the electrode material include sodium, a sodium-potassium alloy, lithium, magnesium, aluminum, a magnesium-silver mixture, a magnesium-indium mixture, an aluminum-lithium alloy, an $Al/Al_2O_3$ mixture and an Al/LiF mixture.

Next, differences in effectiveness between individual conditions in the white organic electroluminescence device 10 of the present embodiment will be described with reference to FIGS. 3 through 7. The effectiveness is evaluated with respect to conditions A and B and comparative examples 1 and 2 by referring to FIG. 3.

(Condition A)

Figure 4:
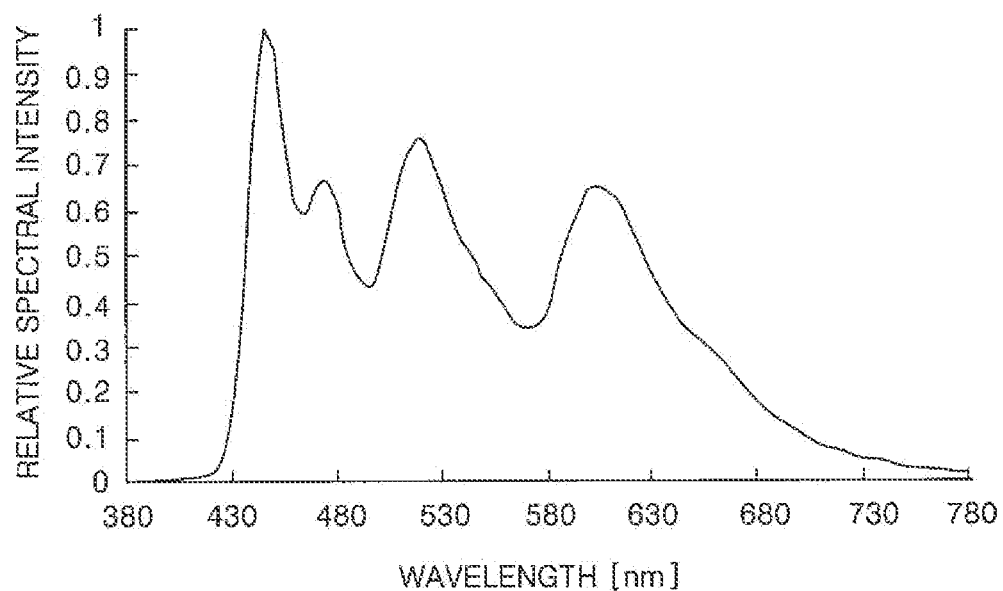
FIG. 4 is a spectral characteristic diagram of the white organic electroluminescence device under condition A.

The relative spectral intensity of a blue light at an emission peak wavelength of about 445 nm is set equal to 1. In this case, the relative spectral intensity of the blue light at an emission wavelength of 475 nm is about 0.65. The emission peak wavelength of a red light is set equal to about 610 nm and the color temperature of the emitted red light is about 6400K. The spectral characteristic of the white organic electroluminescence device 10 thus configured is shown in FIG. 4.

(Condition B)

Figure 5:
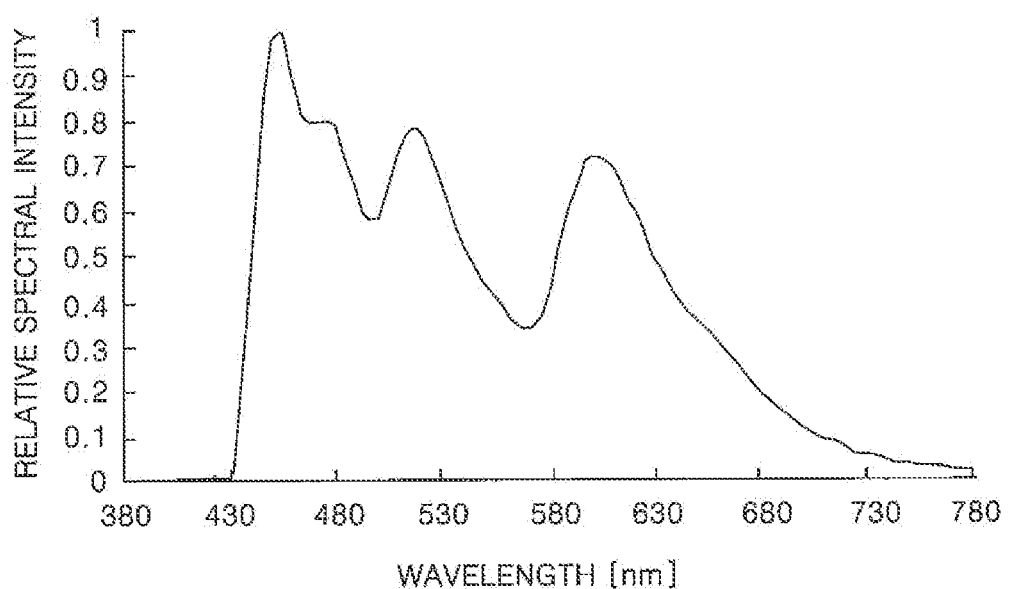
FIG. 5 is a spectral characteristic diagram of the white organic electroluminescence device under condition B.

The relative spectral intensity of a blue light at an emission peak wavelength of about 455 nm is set equal to 1. In this case, the relative spectral intensity of the blue light at an emission wavelength of 485 nm is about 0.8. The emission peak wavelength of a red light is set equal to about 600 nm, and the color temperature of the emitted red light emitted is about 6400K. The spectral characteristic of the white organic electroluminescence device 10 thus configured is shown in FIG. 5.

Comparative Example 1

Figure 6:
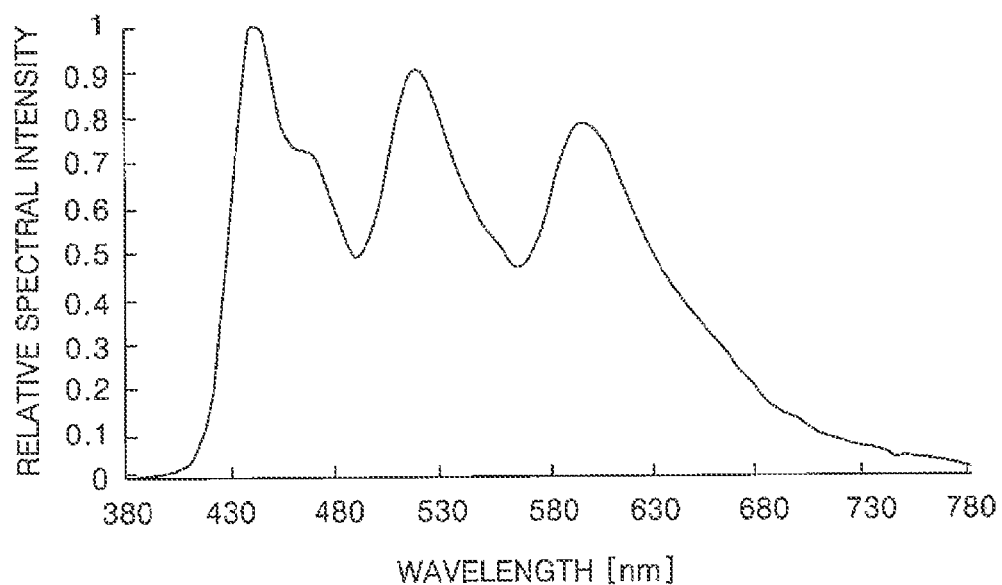
FIG. 6 is a spectral characteristic diagram of a white organic electroluminescence device according to comparative example 1.

The relative spectral intensity of a blue light at an emission peak wavelength of about 440 nm is set equal to 1 In this case, the relative spectral intensity of the blue light at an emission wavelength of 470 nm is about 0.7. The emission peak wavelength of a red light is set equal to about 595 nm and the color temperature of the emitted red light is about 6400K. The spectral characteristic of the white organic electroluminescence device 10 thus configured is shown in FIG. 6

Comparative Example 2

Figure 7:
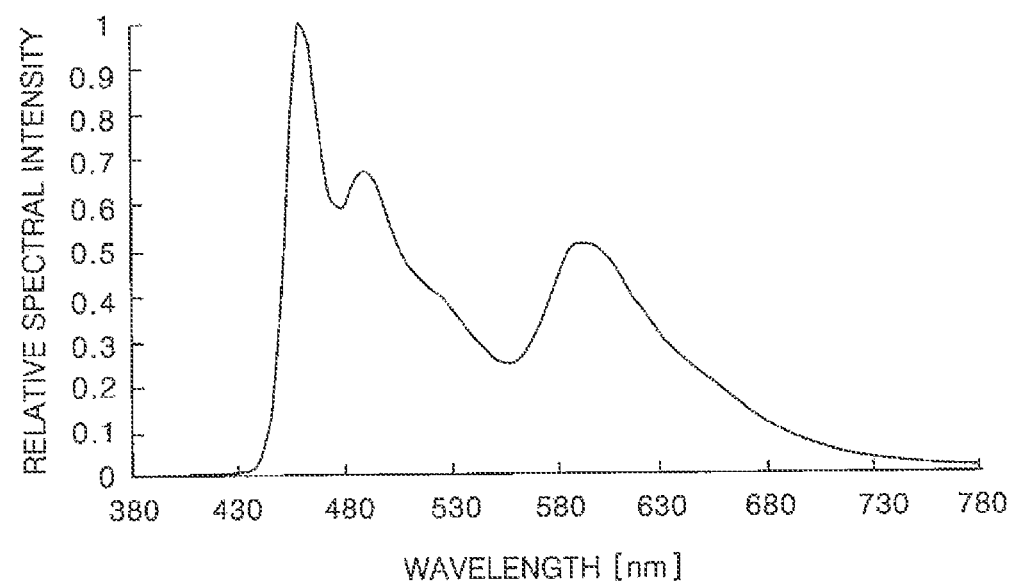
FIG. 7 is a spectral characteristic diagram of a white organic electroluminescence device according to comparative example 2.

The relative spectral intensity of a blue light at an emission peak wavelength of about 460 nm is set equal to 1. In this case, the relative spectral intensity of the blue light at an emission wavelength of 490 nm is about 0.68. The emission peak wavelength of a red light is set equal to about 595 nm, and the color temperature of the emitted red light is about 6100K. The spectral characteristic of the white organic electroluminescence device 10 thus configured is shown in FIG. 7.

Comparison of Condition A with Comparative Examples 1 and 2

If the respective light emission layers 14a and 14b of the present embodiment are configured according to condition. A, the skin color favorability index of Japanese women PS disclosed in, e.g., Japanese Patent Application Publication 1999-258047 can be increased to 90. This value is sufficiently higher than the PS of comparative example 1 which is 66 and the PS of comparative example 2 which is 84. In the respective light emission layers 14a and 14b configured according to condition A, the average color rendering index Ra can be increased to 90. It is possible to obtain a high enough color rendering property as compared with comparative example 2 of which Ra is 73. In addition, the average color rendering index Ra can be increased to 80 or more which value is recommended by JIS Z 9110 "General Provisions on Lighting Standards" as the average color rendering index in a house or an office work space.

Comparison of Condition B with Comparative
Examples 1 and 2

If the respective light emission layers 14a and 14b of the present embodiment are configured according to condition B, the skin color favorabilicy index of Japanese women PS can be increased to 96. This value is higher than the PS of comparative example 1 which is 66 and the PS of comparative example 2 which is 84. In the respective light emission layers 14a and 14b configured according to condition B, the average color rendering index Ra can be increased to 82. It is possible to obtain a high enough color rendering property as compared with comparative example 2 of which Ba is 73. In addition, the average color rendering index Ra can be increased to 80 or more which value is recommended by JIS Z 9110 "General Provisions on Lighting Standards" as the average color rendering index in a house or an office work space.

Next, description will be made on the operation of the present embodiment.

In the white organic electroluminescence device 10 configured as above, when a positive voltage is applied to the anode electrode 12 and a negative voltage is applied to the cathode electrode 16, the holes and the electrons injected into the light emission layer 14 through the hole transport layer 13 and the electron transport layer 15 are recombined, e.g., in the light emission layer 14 and at the interface between the light emission layer 14 and the hole transport layer 13, thereby generating light emission. In this regard, the light emission layer 14 is formed of a plurality of layers (blue, red and green region light emission layers 14a to 14c) laminated one above another. The lights of different colors emitted from the respective layers 14a to 14c are mixed with each other, whereby the device 10 can emit a white light.

Pursuant to the comparison results stated above, the white organic electroluminescence device 10 is configured such that the blue region emission layer 14a has a peak wavelength ranging from 445 nm to 455 nm. This makes it possible to increase the average color rendering index Ra to 80 or more and to increase the skin color favorability index of Japanese women PS to 90 or more. In addition, the device 10 is configured such that the red region emission layer 14b has a peak wavelength of 600 cm or more. This enables the light emitted from the light emission layer 14 to have a longer wavelength, which assists in increasing the skin color favorability index of Japanese women. PS.

Next, description will be made on the distinctive effects provided by the present embodiment.

(1) The light emission layers 14a and 14b are configured to have at least one emission peak lying in each of blue, green and red regions. The emission peak of the blue region emission layer 14a in the blue region exists in a wavelength region between 445 nm and 455 nm. This makes it possible to increase the average color rendering index Ra to 80 or more and to increase the skin color favorability index of Japanese women PS to 90 or more. It is therefore possible to increase the PS value indicating the skin color favorability index, while preventing a decrease in the color rendering property.

(2) The light emission layers 14a and 14b are configured such that the emission peak of the red region emission layer 14b exists in a wavelength region of 600 nm or more. This enables the light emitted from the light emission layer 14 to have a longer wavelength, which assists in increasing the skin color favorability index of Japanese women PS.

The embodiment of the present invention may be modified as follows. While the light emission layer 14 is formed of three layers, namely the blue region emission layer 14a, the red region emission layer 14b and the green region emission layer 14c in the embodiment described above, the number of layers may be arbitrarily changed as long as the light emitted from the respective layers have peak wavelengths (emission peaks) in the blue, red and green wavelength regions.

While not specifically mentioned in the foregoing embodiment, the white organic electroluminescence device 10 may be used as a variety of lighting devices such as a base light, a down-light, a spotlight, a bracket light, a pendant light and a sealing light.

While the invention has been shown and described with respect to the embodiments, the present invention is not limited thereto. It will be understood by those skilled in the art that various changes and modifications may be made without departing from the scope of the invention as defined in the following claims.

What is claimed is:

1. A white organic electroluminescence device for lighting devices, comprising:
    an anode electrode;
    a cathode electrode;
    a hole transport layer arranged between the anode electrode and the cathode electrode;
    an electron transport layer arranged between the anode electrode and the cathode electrode; and
    a light emission layer into which holes and electrons are injected from the hole transport layer and the electron transport layer, the light emission layer arranged between the hole transport layer and the electron transport layer, wherein said light emission layer comprises a blue region emission layer, a red region emission layer, and a green region emission layer,
    wherein the emission layers are configured to emit white light for illumination composed of blue, green and red colors each having an emission peak, and a wavelength of the emission peak of the blue color ranges from about 445 nm to about 455 nm, and
    wherein the blue region emission layer is made of TBP (2,5,8,11 -tetra-t-butylperylene) or sty-NPD, the red region emission layer is made of $PQ_2Ir(acac)$, and the green region emission layer is made of $Ir(ppy)_3$ or C545T (10-1,3-benzothiazol-2-yl)-1,1,7,7-tetramethyl-2,3,6,7-tetrahydro-1H,5H,11H-pyrano[2,3-f]pyrido[3,2,1-ij]quinoline-11-one).

2. The device of claim 1, wherein a wavelength of the emission peak of the red color is about 600 nm or more.

3. The device of claim 2, wherein an intensity of the emission peak of the blue color is substantially higher than an intensity of the emission peak of the red color.

4. The device of claim 2, wherein the blue color has an additional emission peak whose intensity is substantially lower than an intensity of the emission peak whose wavelength ranges from about 445 nm to about 455 nm.

5. The device of claim 1, wherein an intensity of the emission peak of the blue color is substantially higher than an intensity of the emission peak of the red color.

6. The device of claim 3, wherein the blue color has an additional emission peak whose intensity is substantially lower than the intensity of the emission peak whose wavelength ranges from about 445 nm to about 455 nm.

7. The device of claim 5, wherein the blue color has an additional emission peak whose intensity is substantially lower than the intensity of the emission peak whose wavelength ranges from about 445 nm to about 455 nm.

8. The device of claim 1, wherein the blue color has an additional emission peak whose intensity is substantially lower than an intensity of the emission peak whose wavelength ranges from about 445 nm to about 455 nm.

9. A method for providing white light using a white organic electroluminescence device for lighting devices, comprising an anode electrode, a cathode electrode, a hole transport layer arranged between the anode electrode and the cathode electrode, an electron transport layer arranged between the anode electrode and the cathode electrode, and a light emission layer into which holes and electrons are injected from the hole transport layer and the electron transport layer, the light emission layer arranged between the hole transport layer and the electron transport layer, wherein said light emission layer comprises a blue region emission layer, a red region emission layer, and a green region emission layer, said method comprising the steps of:
 increasing an average color rendering index and a skin color favorability index of the white light,
 said increasing the average color rendering index and skin color favorability index comprising the step of controlling the white light to have at least one emission peak in each of the blue, red, and green regions,
 wherein a wavelength of the emission peak of the blue color ranges from about 445 nm to about 455 nm.

10. The method according to claim 9, wherein a wavelength of the emission peak of a red color is about 600 nm or more.

11. The method according to claim 9, wherein an intensity of the emission peak of the blue color is substantially higher than an intensity of the emission peak of a red color.

12. The method according to claim 10, wherein an intensity of the emission peak of a blue color is substantially higher than an intensity of the emission peak of the red color.

13. The method according to claim 9, wherein the blue region emission layer is made of TBP (2,5,8,11-tetra-t-butylperylene) or sty-NPD, the red region emission layer is made of $PQ_2Ir(acac)$, and the green region emission layer is made of $Ir(ppy)_3$ or C545T (10-1,3-benzothiazol-2-yl)-1,1,7,7-tetramethyl-2,3,6,7-tetrahydro-1H,5H,11H-pyrano[2,3-f]pyrido[3,2,1-ij]quinoline-11-one).

* * * * *